(12) United States Patent
Hasebe et al.

(10) Patent No.: US 9,970,110 B2
(45) Date of Patent: May 15, 2018

(54) PLASMA PROCESSING APPARATUS

(71) Applicant: TOKYO ELECTRON LIMITED, Tokyo (JP)

(72) Inventors: Kazuhide Hasebe, Nirasaki (JP); Jun Ogawa, Nirasaki (JP); Akira Shimizu, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 326 days.

(21) Appl. No.: 14/518,151

(22) Filed: Oct. 20, 2014

(65) Prior Publication Data
US 2015/0107517 A1 Apr. 23, 2015

(30) Foreign Application Priority Data

Oct. 21, 2013 (JP) .................................. 2013-218535

(51) Int. Cl.
*C23C 16/455* (2006.01)
*H05H 1/46* (2006.01)
(Continued)

(52) U.S. Cl.
CPC ...... *C23C 16/45582* (2013.01); *C23C 16/452* (2013.01); *C23C 16/45523* (2013.01);
(Continued)

(58) Field of Classification Search
CPC ............. H01J 37/32532; H01J 37/3244; H01J 37/32009; H01J 37/32568;
(Continued)

(56) References Cited

U.S. PATENT DOCUMENTS

| | | | | |
|---|---|---|---|---|
| 5,217,560 A | * | 6/1993 | Kurono | H01J 37/3244 118/723 R |
| 2006/0257568 A1 | * | 11/2006 | Hasebe | C23C 16/455 427/248.1 |

(Continued)

FOREIGN PATENT DOCUMENTS

| | | |
|---|---|---|
| JP | H4-264715 A | 9/1992 |
| JP | 05-251391 A | 9/1993 |

(Continued)

*Primary Examiner* — Rakesh K Dhingra
*Assistant Examiner* — Laureen Chan
(74) *Attorney, Agent, or Firm* — Nath, Goldberg & Meyer; Jerald L. Meyer

(57) ABSTRACT

A plasma processing apparatus includes a plasma generation chamber in which plasma active species are generated, a process chamber configured to accommodate processing target objects stacked in a vertical direction, the plasma active species generated in the plasma generation chamber being supplied into the process chamber, a plasma source gas supply pipe disposed inside the plasma generation chamber and extending in the vertical direction, a plasma source gas being introduced from one end of the plasma source gas supply pipe and discharged through gas discharge holes formed in the plasma source gas supply pipe in the vertical direction, and a pair of plasma electrodes, arranged to face each other, configured to apply an electric field to the plasma source gas discharged into the plasma generation chamber. A size of a discharge area interposed between the pair of plasma electrodes is varied in the vertical direction.

6 Claims, 10 Drawing Sheets

(51) Int. Cl.
*C23C 16/509* (2006.01)
*C23C 16/452* (2006.01)
*H01J 37/32* (2006.01)

(52) U.S. Cl.
CPC .... *C23C 16/45578* (2013.01); *H01J 37/3244* (2013.01); *H01J 37/32091* (2013.01); *H01J 37/32568* (2013.01)

(58) Field of Classification Search
CPC ........... H01J 37/32348; H01J 37/32541; H01J 37/32091; H01J 37/32357; H01J 37/32082; C23C 16/45546; C23C 16/452; C23C 16/45582; C23C 16/45523; C23C 16/45578; C23C 16/45548; C23C 16/45563; C23C 16/45574; C23C 16/45559; C23C 16/509; H05H 2001/466; H05H 2001/4675; H05H 2001/2406; H05H 2001/2418; H05H 2001/2425; H05H 2001/245; H01L 21/67303
See application file for complete search history.

(56) References Cited

U.S. PATENT DOCUMENTS

| | | | | |
|---|---|---|---|---|
| 2008/0075838 | A1* | 3/2008 | Inoue | C23C 8/10 427/58 |
| 2008/0173238 | A1* | 7/2008 | Nakashima | C23C 16/345 118/723 R |
| 2012/0100722 | A1* | 4/2012 | Asai | C23C 16/08 438/758 |
| 2012/0225218 | A1* | 9/2012 | Savas | C23C 16/45574 427/576 |

FOREIGN PATENT DOCUMENTS

| | | | |
|---|---|---|---|
| JP | 06-2680 U | | 1/1994 |
| JP | 08-316221 A | | 11/1996 |
| JP | 08316221 A | * | 11/1996 |
| JP | 2002280378 A | | 9/2002 |
| JP | 2004343017 A | | 12/2004 |
| JP | 2005083766 A | | 3/2005 |
| JP | 2007266297 A | | 10/2007 |
| JP | 2008-511993 A | | 4/2008 |
| JP | 2008300444 A | | 12/2008 |
| JP | 2009076876 A | | 4/2009 |
| JP | 2010-272355 A | | 12/2010 |
| JP | 2012-114200 A | | 6/2012 |
| KR | 10-2010-0086947 A | | 8/2010 |
| KR | 10-2007-0051279 B1 | | 10/2012 |
| WO | WO 2006026350 A2 * | 3/2006 | ........... C23C 16/345 |

\* cited by examiner

Reference example

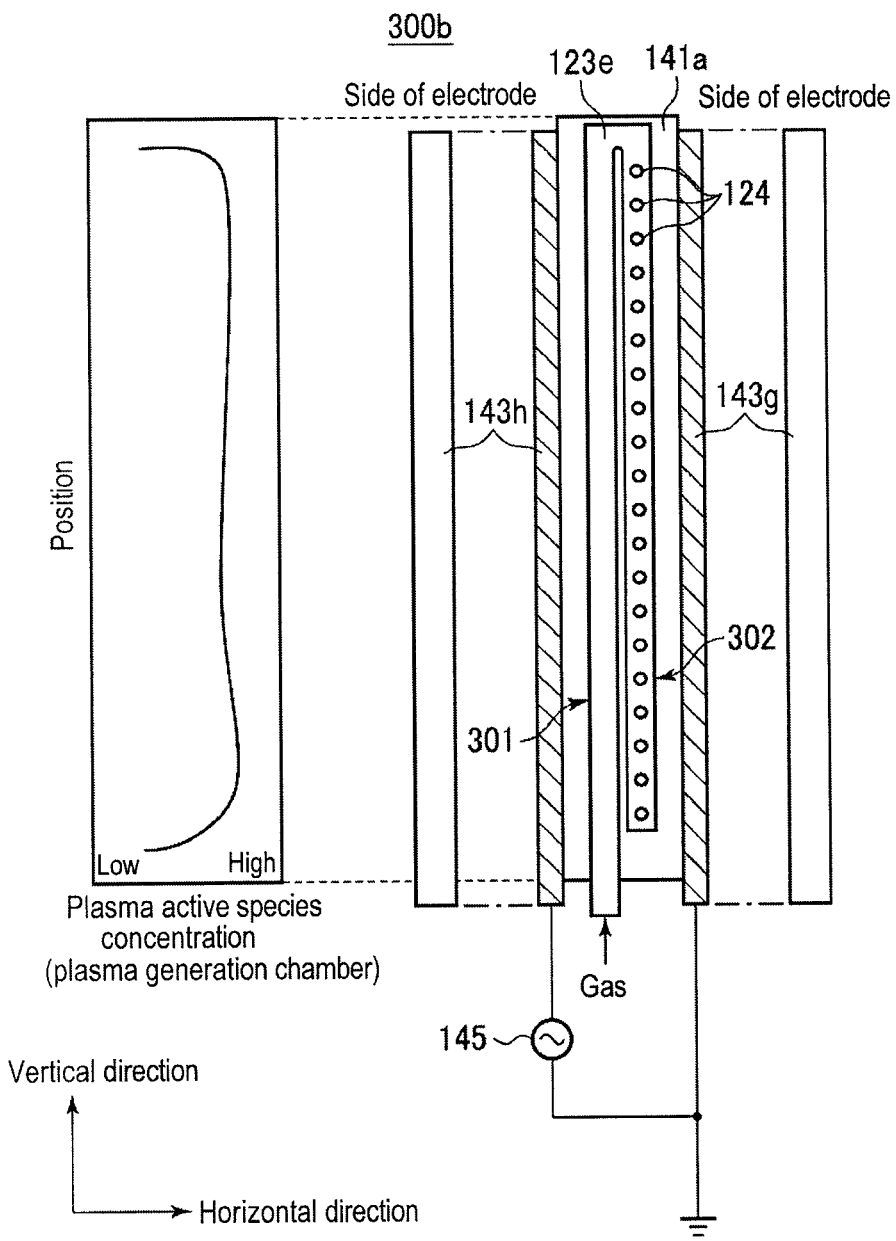

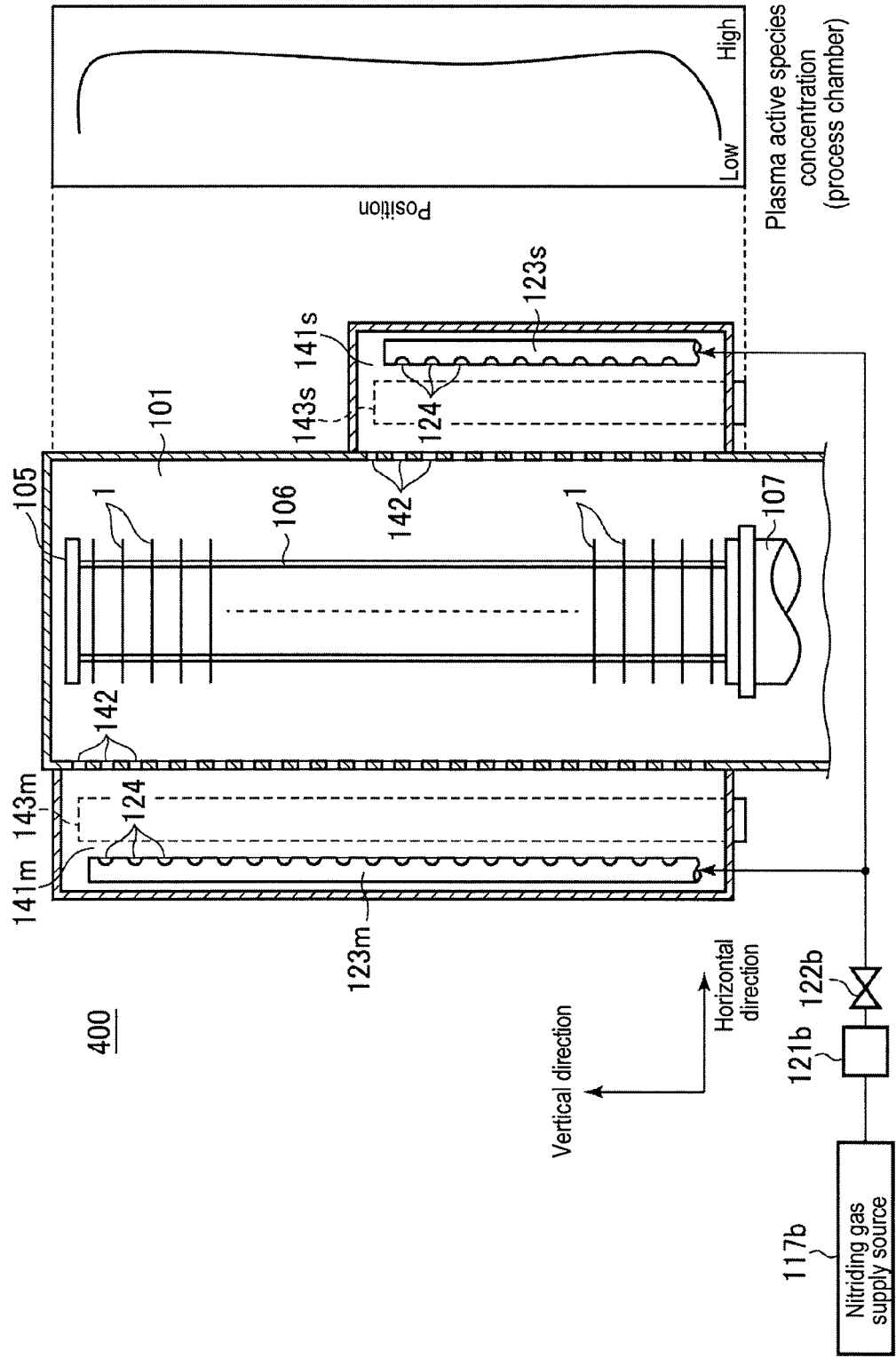

PLASMA PROCESSING APPARATUS

CROSS-REFERENCE TO RELATED APPLICATION

This application claims the benefit of Japanese Patent Application No. 2013-218535, filed on Oct. 21, 2013, in the Japan Patent Office, the disclosure of which is incorporated herein in its entirety by reference.

TECHNICAL FIELD

The present disclosure relates to a plasma processing apparatus.

BACKGROUND

In manufacturing semiconductor integrated circuit devices, semiconductor wafers are subjected to various processes including a deposition process and so on. As one example of the deposition process, there is a CVD method which is a kind of vapor phase growth method. In the CVD method, a source gas serving as a source of a thin film is decomposed by a chemical reaction thereby solidifying the source gas and depositing it on a semiconductor wafer.

The CVD method typically includes two types, i.e., a thermal CVD method in which high-temperature heat is used to decompose the source gas and a plasma CVD method in which a decomposition promoting action caused by discharged plasma is used to decompose the source gas. In particular, the plasma CVD method is in wide use for low temperature processes since films can be formed at a temperature lower than that in the thermal CVD method. There is a plasma processing apparatus for forming thin films using the plasma CVD method as indicated below.

Such a plasma processing apparatus may be configured as a batch type capable of achieving a higher throughput than a single wafer type. In addition, the plasma processing apparatus may be configured as a vertical batch type to allow semiconductor wafers to be vertically stacked and accommodated in a process chamber. A vertical batch type plasma processing apparatus may be possible to achieve a higher throughput than a horizontal batch type plasma processing apparatus in which semiconductor wafers are horizontally arranged and accommodated in a process chamber.

High integration and miniaturization of semiconductor integrated circuit devices have been developed up to now. As described above, since a vertical batch type plasma processing apparatus is structured to vertically stack and accommodate semiconductor wafers in a process chamber, it can improve "throughput". However, due to structural features, a subtle difference may occur in a deposition rate and/or film quality between semiconductor wafers disposed on upper stages of the process chamber and semiconductor wafers disposed on lower stages thereof.

Since such a subtle difference in the deposition rate and/or film quality lies within an allowable range, it may not act as a critical hindrance to the manufacture of semiconductor integrated circuit devices so far. However, in view of further development of the high integration and miniaturization in the future, such a subtle difference in the deposition rate and/or film quality may act as any hindrance to the manufacture of semiconductor integrated circuit devices.

SUMMARY

Some embodiments of the present disclosure provide a plasma processing apparatus capable of further reducing a subtle difference in a deposition rate and/or film quality between processing target objects disposed on upper stages of a process chamber and workpieces disposed on lower stages thereof.

According to a first aspect of the present disclosure, there is provided a plasma processing apparatus including a plasma generation chamber in which plasma active species are generated, a process chamber configured to accommodate therein processing target objects which are stacked in a vertical direction, the plasma active species generated in the plasma generation chamber being supplied into the process chamber, a plasma source gas supply pipe disposed inside the plasma generation chamber and extending in the vertical direction, a plasma source gas serving as a plasma source being introduced from one end of the plasma source gas supply pipe and discharged through a plurality of gas discharge holes which is formed in the plasma source gas supply pipe in the vertical direction, and a pair of plasma electrodes, arranged to face each other, configured to apply an electric field to the plasma source gas discharged into the plasma generation chamber, wherein a size of a discharge area interposed between the pair of plasma electrodes is varied in the vertical direction.

According to a second aspect of the present disclosure, there is provided a plasma processing apparatus including a plasma generation chamber in which plasma active species are generated, a process chamber configured to accommodate therein processing target objects which are stacked in a vertical direction, the plasma active species generated in the plasma generation chamber being supplied into the process chamber, a plasma source gas supply pipe disposed inside the plasma generation chamber and extending in the vertical direction, a plasma source gas serving as a plasma source being introduced from one end of the plasma source gas supply pipe and discharged through a plurality of gas discharge holes which is formed in the plasma source gas supply pipe in the vertical direction, and a pair of plasma electrodes, arranged to face each other, configured to apply an electric field to the plasma source gas discharged into the plasma generation chamber, wherein the pair of plasma electrodes is divided into a plurality of pairs of plasma sub-electrodes in the vertical direction, and the pair of plasma electrodes is configured such that a magnitude of RF power applied to each pair of plasma sub-electrodes is different from each other.

According to a third aspect of the present disclosure, there is provided plasma processing apparatus including a plasma generation chamber in which plasma active species are generated, a process chamber configured to accommodate therein processing target objects which are stacked in a vertical direction, the plasma active species generated in the plasma generation chamber being supplied into the process chamber, a plasma source gas supply pipe disposed inside the plasma generation chamber and extending in the vertical direction, a plasma source gas serving as a plasma source being introduced from one end of the plasma source gas supply pipe and discharged through a plurality of gas discharge holes which is formed in the plasma source gas supply pipe in the vertical direction, and a pair of plasma electrodes, arranged to face each other, configured to apply an electric field to the plasma source gas discharged into the plasma generation chamber, wherein the one end of the plasma source gas supply pipe is disposed in one end side of the plasma generation chamber, and the plasma source gas supply pipe extends in the vertical direction from the one end side of the plasma generation chamber to the other end side of the plasma generation chamber and is folded from the other end side toward the one end side.

According to a fourth aspect of the present disclosure, there is provided a plasma processing apparatus including a main plasma generation chamber and a sub plasma generation chamber in which plasma active species are generated, a process chamber configured to accommodate therein processing target objects which are stacked in a vertical direction, the plasma active species generated in the main plasma generation chamber and the sub plasma generation chamber being supplied into the process chamber, a first plasma source gas supply pipe disposed inside the main plasma generation chamber and extending in the vertical direction, a plasma source gas serving as a plasma source being introduced from one end of the first plasma source gas supply pipe and discharged through a first plurality of first gas discharge holes which is formed in the first plasma source gas supply pipe in the vertical direction, a first pair of plasma electrodes, arranged to face each other, configured to apply an electric field to the plasma source gas discharged into the main plasma generation chamber, a second plasma source gas supply pipe disposed inside the sub plasma generation chamber and extending in the vertical direction, a plasma source gas serving as a plasma source being introduced from one end of the second plasma source gas supply pipe and discharged through a second plurality of gas discharge holes which is formed in the second plasma source gas supply pipe in the vertical direction, and a second pair of second plasma electrodes, arranged to face each other, configured to apply an electric field to the plasma source gas discharged into the sub plasma generation chamber, wherein the main plasma generation chamber extends in the vertical direction from one end side of the process chamber to the other end side of the process chamber, and wherein the sub plasma generation chamber extends in the vertical direction from the vicinity of one end of the process chamber up to a middle portion of the process chamber.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is a sectional view showing a plasma processing apparatus according to a second modification of the third embodiment of the present disclosure.

FIG. 10 is a sectional view showing a plasma processing apparatus according to a fourth embodiment of the present disclosure.

DETAILED DESCRIPTION

Figure 1:
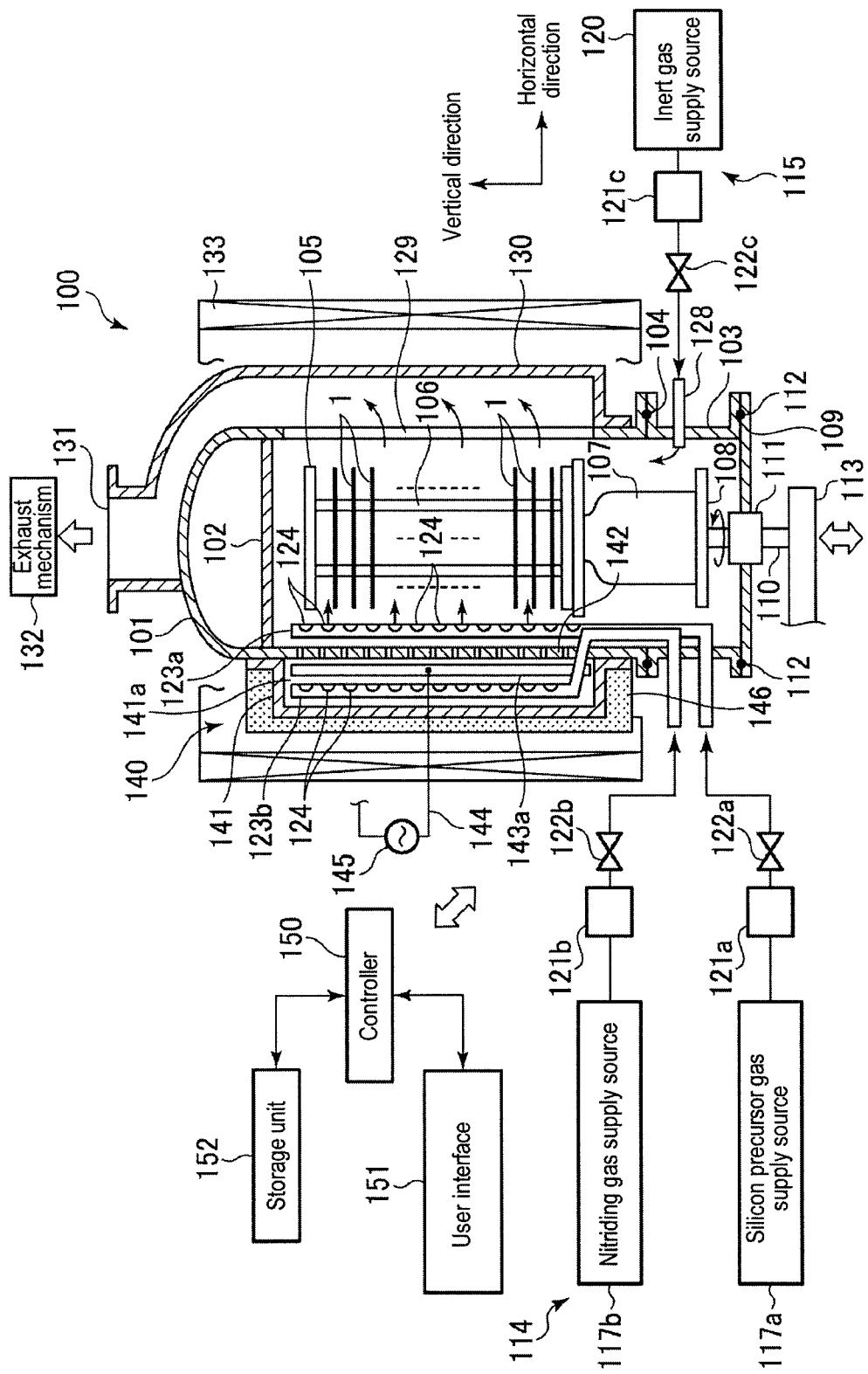
FIG. 1 is a longitudinal sectional view schematically showing a plasma processing apparatus according to a first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. Throughout the drawings, the same elements are denoted by the same reference numerals.

First Embodiment

Figure 2:
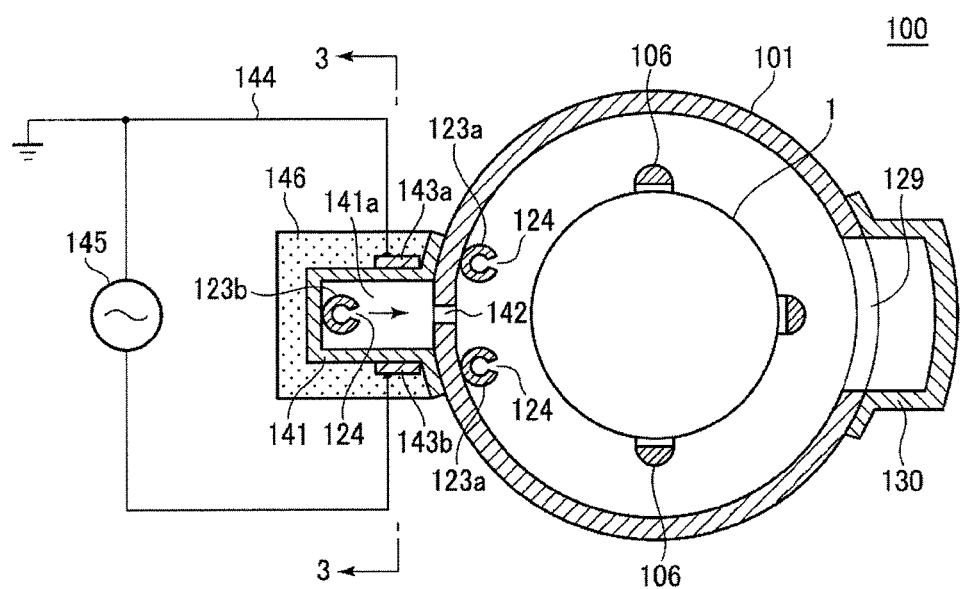
FIG. 2 is a horizontal sectional view of the plasma processing apparatus shown in FIG. 1.

FIG. 1 is a longitudinal sectional view schematically showing a plasma processing apparatus according to a first embodiment of the present disclosure, and FIG. 2 is a horizontal sectional view of the plasma processing apparatus shown in FIG. 1.

As shown in FIGS. 1 and 2, the plasma processing apparatus 100 includes a cylindrical process chamber 101 having an opened bottom and a ceiling. The process chamber 101 is entirely made of, for example, quartz. A ceiling plate 102 made of quartz is installed in the ceiling of the process chamber 101. A cylindrical manifold 103 made of, for example, stainless steel is connected to the opening of the bottom of the process chamber 101 via a seal member 104 such as an O-ring or the like.

The manifold 103 supports the bottom of the process chamber 101. A vertical wafer boat 105 is inserted in the process chamber 101 from below the manifold 103. The vertical wafer boat 105 has a plurality of rods 106, each of which is formed with a plurality of support grooves (not shown) for supporting portions of the peripheries of a plurality of (for example, 50 to 100) workpieces or target processing objects (e.g., semiconductor wafers 1). Thus, the semiconductor wafers 1 are vertically stacked (in a height direction) in multiple stages on the vertical wafer boat 105. In one typical example, the semiconductor wafers 1 may be silicon wafers.

The vertical wafer boat 105 is placed on a table 108 via a heat-insulating tube 107 made of quartz. The table 108 is supported on a rotary shaft 110 penetrating through a cover 109 made of, for example, stainless steel which opens/closes an opening of the bottom of the manifold 103. In a penetrating portion of the rotary shaft 110, for example, a magnetic fluid seal 111 is installed to air-tightly seal and rotatably support the rotary shaft 110. A seal member 112 such as an O-ring is interposed between the peripheral portion of the cover 109 and the bottom of the manifold 103. In such a manner, it is possible to maintain sealability of the process chamber 101. The rotary shaft 110 is installed in a leading end of an arm 113 supported by an elevation mechanism (not shown) such as a boat elevator or the like. With such a configuration, the vertical wafer boat 105 and the cover 109 are integrally elevated and inserted/removed in/from the process chamber 101.

The plasma processing apparatus 100 includes a process gas supply mechanism 114 for supplying a process gas into the process chamber 101 and an inert gas supply mechanism 115 for supplying an inert gas into the process chamber 101. The plasma processing apparatus 100 may form a silicon nitride film on a surface (to be processed) of the semiconductor wafer 1, as one example of plasma processing.

The process gas supply mechanism 114 includes a silicon precursor gas supply source 117a and a nitriding gas supply source 117b. The inert gas supply mechanism 115 includes an inert gas supply source 120.

For example, a silicon precursor gas supplied from the silicon precursor gas supply source 117a is a $Si_2Cl_6$ gas. The $Si_2Cl_6$ gas may be used to form a silicon film on the surface of the semiconductor wafer 1. For instance, a nitriding gas supplied from the nitriding gas supply source 117b is a $NH_3$ gas. The $NH_3$ gas may be used to nitride the silicon film formed on the surface to thereby form a silicon nitride film. As an example, an inert gas supplied from the inert gas supply source 120 is an Ar gas. The Ar gas is used for dilution, purging and so on of a gas which has been supplied into the process chamber 101.

The silicon nitride film is, for example, formed according to the following steps.

(1) The silicon film is formed on the surface of the semiconductor wafer 1 accommodated in the process chamber 101 by supplying the silicon precursor gas onto the surface.

(2) The process chamber 101 is purged with the inert gas.

(3) Plasma active species (N radicals, NH radicals and so on) are generated by exciting (or plasmarizing) the nitriding gas and the nitriding gas containing the plasma active species is supplied onto the surface of the semiconductor wafer 1 on which the silicon film is formed. Thus, the silicon nitride film is formed by nitriding the silicon film.

(4) The process chamber 101 is purged with the inert gas.

(5) The above steps (1) to (4) are sequentially repeated until the thickness of the silicon nitride film reaches a designed film thickness.

The silicon precursor gas supply source 117a is connected to a precursor gas supply pipe 123a via a flow rate controller 121a and an opening/closing valve 122a. In addition, the nitriding gas supply source 117b is connected to a plasma source gas supply pipe 123b via a flow rate controller 121b and an opening/closing valve 122b.

The precursor gas supply pipe 123a and the plasma source gas supply pipe 123b made of quartz penetrate inward through the side wall of the manifold 103 and extend vertically after being bent upward. A plurality of gas discharge holes 124 is formed at predetermined intervals in vertical portions of the precursor gas supply pipe 123a and the plasma source gas supply pipe 123b. With such a configuration, each of the gases is substantially uniformly discharged into the process chamber 101 through the gas discharge holes 124 in the horizontal direction.

A plasma generation mechanism 140 is installed in a portion of the side wall of the process chamber 101. The plasma generation mechanism 140 generates plasma active species such as nitrogen radicals ($N^+$) or ammonia radicals ($NH^+$) by applying energy to the nitriding gas to excite the nitriding gas. The plasma generation mechanism 140 has a plasma partition wall 141 defining a plasma generation chamber 141a in which the plasma active species are generated. The plasma partition wall 141 is made of, for example, quartz. The plasma generation chamber 141a partitioned by the plasma partition wall 141 is in communication with the process chamber 101 via a plurality of openings 142 formed in the side wall of the process chamber 101. The plurality of openings 142 is arranged in the vertical direction to cover all semiconductor wafers 1 supported by the vertical wafer boat 105 in the vertical direction. The plasma source gas supply pipe 123b is disposed inside the plasma generation chamber 141a.

A pair of elongated plasma electrodes 143a and 143b disposed to face each other in the vertical direction is installed on the outer surfaces of both side walls of the plasma partition wall 141. The pair of plasma electrodes 143a and 143b is interconnected via, for example, a feed line 144. A RF power supply 145 for supplying RF power to the pair of plasma electrodes 143a and 143b is connected to the feed line 144. Although, in some examples, a portion of the feed line 144 connecting the plasma electrode 143a and the RF power supply 145 is grounded, it may not be grounded. The RF power supply 145 applies a RF voltage of, for example, 13.56 MHz to the pair of plasma electrodes 143a and 143b. In such a configuration, a RF electric field is applied to the plasma source gas (e.g., $NH_3$ gas) discharged into the plasma generation chamber 141a. In addition, the nitriding gas discharged from the plasma source gas supply pipe 123b is exited within the plasma generation chamber 141a to which the RF electric field is applied, thereby generating a plasma gas containing active nitrogen such as nitrogen radicals or ammonia radicals. The plasma gas is supplied into the process chamber 101 through the plurality of openings 142.

An insulating protection cover 146 made of, for example, quartz is installed on the outer side of the plasma partition wall 141 so as to cover the plasma partition wall 141. A refrigerant passage (not shown) is installed in the inner side of the insulating protection cover 146, so that the pair of plasma electrodes 143a and 143b can be cooled, for example by flowing a cooled nitrogen gas through the refrigerant passage.

The inert gas supply source 120 is connected to a nozzle 128 via a flow rate controller 121c and an opening/closing valve 122c. The nozzle 128 penetrates through the side wall of the manifold 103 and discharges the inert gas from a leading end thereof in the horizontal direction.

An exhaust port 129 for exhausting the interior of the process chamber 101 is formed in a portion of the side wall of the process chamber 101 located on the opposite side to the precursor gas supply pipe 123a and the plasma source gas supply pipe 123b. The exhaust port 129 is formed to be elongated by cutting the side wall of the process chamber 101 vertically. An exhaust port cover member 130 having a "U"-shaped section to cover the exhaust port 129 is installed by welding in a portion of the process chamber 101 corresponding to the exhaust port 129. The exhaust port cover member 130 extends upward along the side wall of the process chamber 101 and defines a gas outlet 131 above the process chamber 101. An exhaust mechanism 132 including a vacuum pump or the like is connected to the gas outlet 131. The exhaust mechanism 132 exhausts the interior of the process chamber 101 such that a process gas used for processing is exhausted and the internal pressure of the process chamber 101 is set to a process pressure depending on the processing.

A cylindrical heater 133 is installed in the periphery of the process chamber 101. The heater 133 activates a gas supplied into the process chamber 101 and heats a workpiece (e.g., the semiconductor wafer 1) accommodated in the process chamber 101.

A variety of components of the plasma processing apparatus 100 is controlled by a controller 150 such as a microprocessor (computer). The controller 150 is connected with a user interface 151 including a touch panel to allow a user to input commands for managing the plasma processing apparatus 100, a display for visualizing and displaying operation status of the plasma processing apparatus 100 and so on.

The controller 150 is connected to a storage unit 152. The storage unit 152 stores control programs for implementing various processes performed by the plasma processing apparatus 100 with the control of the controller 150, and programs (i.e., recipes) for causing various components of the plasma processing apparatus 100 to perform respective processes according to process conditions. The recipes are stored in a storage medium in the storage unit 152. The storage medium may be a hard disk, a semiconductor memory, or a transportable recording medium such as a CD-ROM, DVD, flash memory or the like. In addition, the recipes may be appropriately received from other apparatuses through, for example, dedicated lines. The recipes are read from the storage unit 152 according to instructions from the user interface 151 as necessary. When the controller 150 executes processes based on the read recipes, the plasma processing apparatus 100 performs an intended plasma process under the control of the controller 150.

Figure 3:
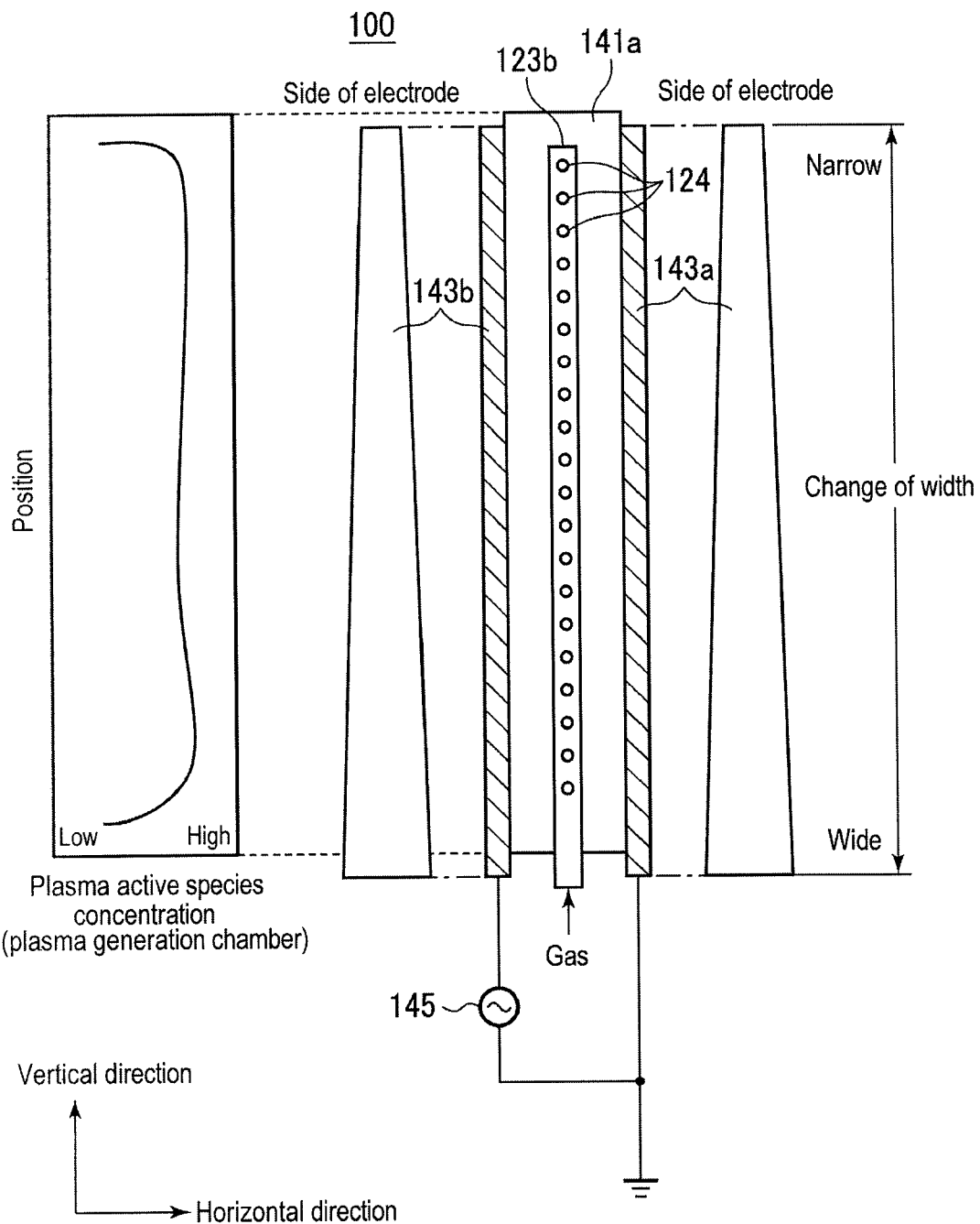
FIG. 3 is a sectional view taken along line 3-3 in FIG. 2.

FIG. 3 is a sectional view taken along line 3-3 in FIG. 2. FIG. 3 also shows a side view of the plasma electrodes 143*a* and 143*b* and a concentration distribution diagram of plasma active species generated in the plasma generation chamber 141*a*.

As shown in FIG. 3, the plasma processing apparatus 100 according to the first embodiment changes a size of a discharge area, which is formed within the plasma generation chamber 141*a* and is interposed between the pair of plasma electrodes 143*a* and 143*b*, in the vertical direction. More specifically, a width of the pair of plasma electrodes 143*a* and 143*b* facing the discharge area has a trapezoidal shape which is wide in one end side of the plasma source gas supply pipe 123*b* and gets narrower toward the other end side thereof. The one end side of the plasma source gas supply pipe 123*b* corresponds to the lower part of the plasma generation chamber 141*a* where the plasma source gas as a plasma source is introduced. The other end side corresponds to the upper part of the plasma generation chamber 141*a*.

Figure 4:
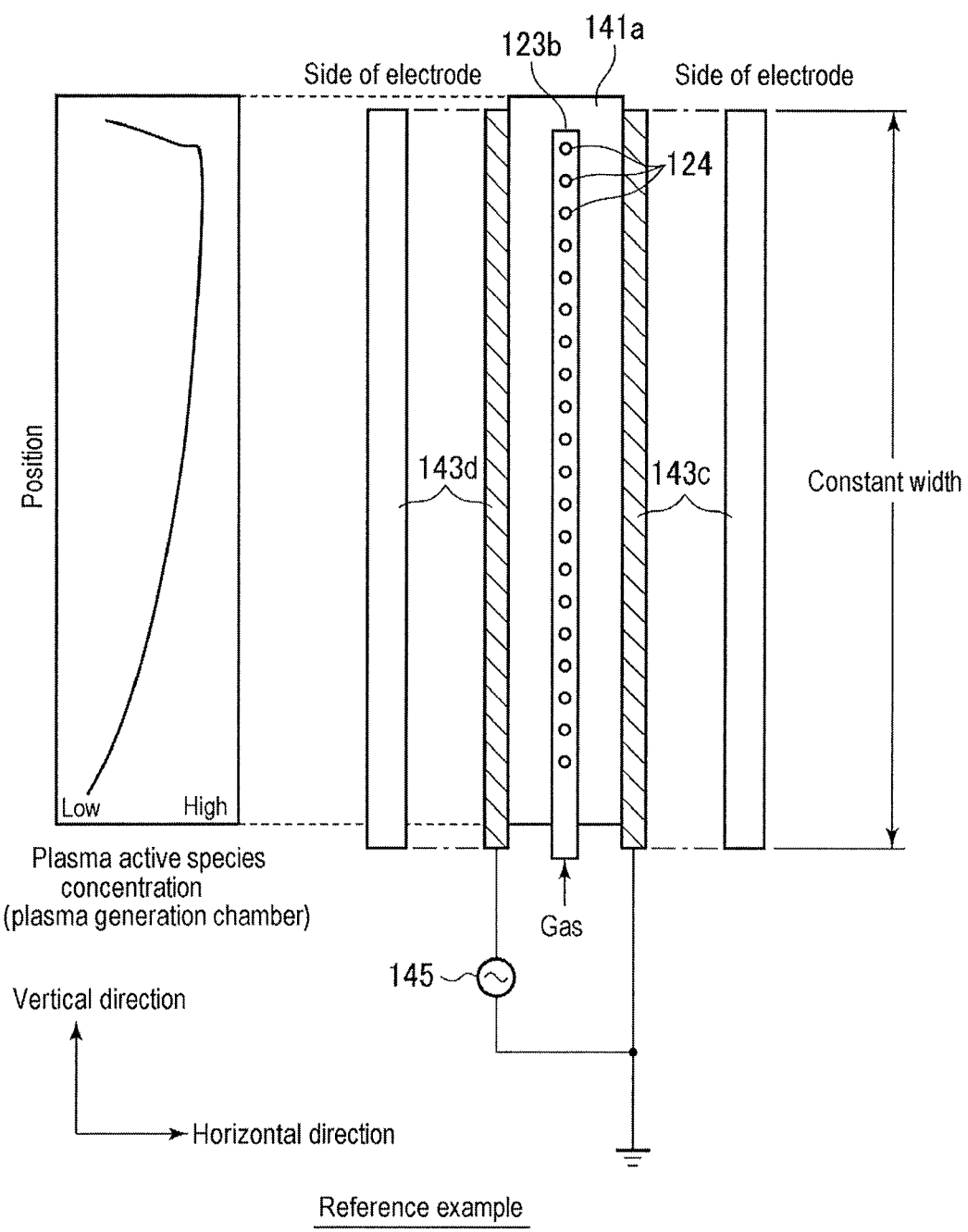
FIG. 4 is a sectional view showing a plasma processing apparatus according to a reference example.

FIG. 4 is a sectional view showing a plasma processing apparatus according to a reference example. FIG. 4 shows a sectional view corresponding to FIG. 3, a side view of plasma electrodes 143*c* and 143*d* and a concentration distribution diagram of plasma active species generated in the plasma generation chamber 141*a*.

As shown in FIG. 4, the width of the pair of plasma electrodes 143*c* and 143*d* facing the discharge area is constant from one end to the other end. When such plasma electrodes 143*c* and 143*d* are used, the concentration of plasma active species generated in the plasma generation chamber 141*a* tends to be low in the lower part of the plasma generation chamber 141*a* and high in the upper part thereof. This is because the plasma source gas supply pipe 123*b* extends in the vertical direction and accordingly exposure time of the plasma source gas to the RF electric field becomes different in the one end side (the lower part) and the other end side (the upper part) of the plasma source gas supply pipe 123*b*.

As used herein, the plasma active species may include nitrogen radicals, nitrogen ions, hydrogen ions, NH radicals or the like if a $NH_3$ gas is used to form a nitride film such as a silicon nitride film using a plasma process. The plasma active species may include oxygen radicals or oxygen ions if an $O_2$ gas is used to form an oxide film such as a silicon oxide film using a plasma process.

If the concentration distribution of plasma active species in the plasma generation chamber 141*a* becomes non-uniform, a concentration distribution of plasma active species supplied from the plasma generation chamber 141*a* into the process chamber 101 in the horizontal direction becomes non-uniform as well. A plurality of semiconductor wafers 1 is stacked and accommodated in the vertical direction in the process chamber 101. In such a manner, the concentration of plasma active species supplied onto the surfaces of the semiconductor wafers 1 disposed on the upper stages of the process chamber 101 becomes different from the concentration of plasma active species supplied onto the surfaces of the semiconductor wafers 1 disposed on the lower stages of the process chamber 101. Such a difference between the concentrations of supplied plasma active species results in a subtle difference in a deposition rate between the semiconductor wafers 1 disposed on the upper stages of the process chamber 101 and the semiconductor wafers 1 disposed on the lower stages thereof. Specifically, the deposition rate of the semiconductor wafers 1 is low in the lower stages of the process chamber 101 and becomes higher toward the upper stages thereof. Although the deposition rate difference is herein described, film quality is also subtly varied due to the concentration distribution of plasma active species.

As opposed to the above reference example, in the plasma processing apparatus 100 according to the first embodiment, the width of the pair of plasma electrodes 143*a* and 143*b* facing the discharge area is wide in the one end side (the lower part) of the plasma source gas supply pipe 123*b* and gets narrower toward the other end side (the upper part) thereof. Such an electrode configuration allows the size of the discharge area formed within the plasma generation chamber 141*a* to be large in the lower part of the plasma generation chamber 141*a* and small in the upper part thereof.

With this configuration, it is possible to widen the discharge area in the one end side (the lower part) of the plasma source gas supply pipe 123*b* where exposure time of the plasma source gas to the RF electric field is relatively short, so that the generation of the plasma active species in the lower part is more prominent than that in the upper part. Also, it is possible to narrow the discharge area in the other end side (the upper part) of the plasma source gas supply pipe 123*b* where exposure time of the plasma source gas to the RF electric field is relatively long, so that the generation of the plasma active species in the upper part is less prominent than that in the lower part.

As described above, in the first embodiment, by changing the size of the discharge area, the concentration distribution of plasma active species generated in the plasma generation chamber 141*a* can become uniform. In addition, the concentration distribution of plasma active species in the plasma generation chamber 141*a* can be improved over the plasma processing apparatus according to the reference example, as can be seen from the concentration distribution diagram shown in FIG. 3.

With these configurations of the plasma processing apparatus 100 according to the first embodiment, as the concentration distribution of plasma active species supplied from the plasma generation chamber 141*a* into the process chamber 101 through the plurality of openings 142 in the horizontal direction becomes more uniform. Thus, a subtle difference in a deposition rate and/or film quality between the semiconductor wafers 1 disposed on the upper stages of the process chamber 101 and the semiconductor wafers 1 disposed on the lower stages thereof may be further reduced.

One Modification of First Embodiment

Figure 5:
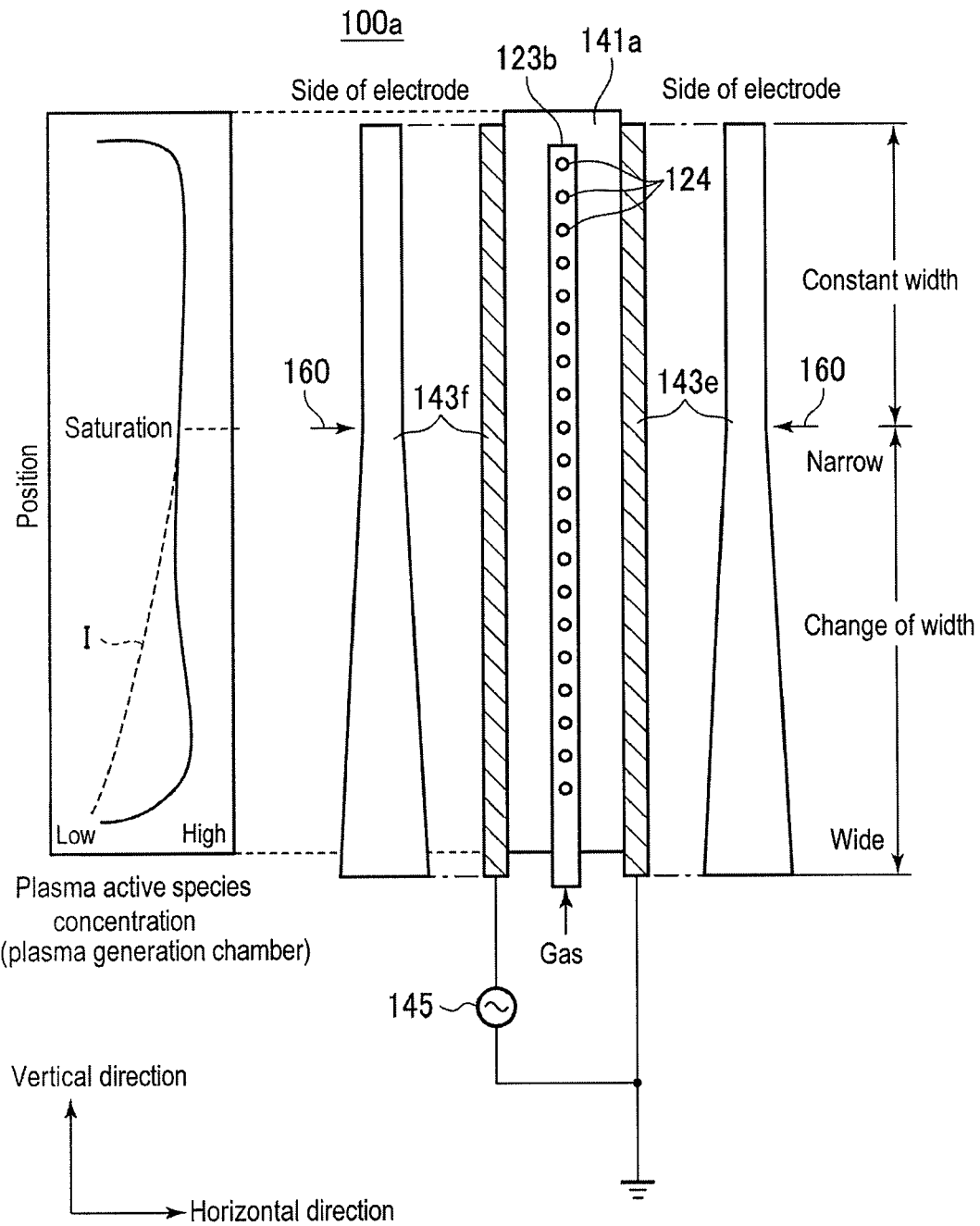
FIG. 5 is a sectional view showing a plasma processing apparatus according to one modification of the first embodiment of the present disclosure.

FIG. 5 is a sectional view showing a plasma processing apparatus according to one modification of the first embodiment of the present disclosure. FIG. 5 shows a sectional view corresponding to FIG. 3, a side view of the plasma electrodes 143e and 143f and a concentration distribution diagram of plasma active species in the plasma generation chamber 141a.

As shown in FIG. 5, a plasma processing apparatus 100a according to one modification of the first embodiment has the same configuration as the plasma processing apparatus 100 according to the first embodiment shown in FIG. 3 in that the width of the pair of plasma electrodes 143e and 143f facing the discharge area is wide in the one end side (the lower part) of the plasma source gas supply pipe 123b and narrow in the other end side (the upper part) thereof. The plasma processing apparatus 100a according to the one modification is different from the plasma processing apparatus 100 according to the first embodiment in that the width of the pair of plasma electrodes 143e and 143f facing the discharge area is constant from a middle portion (or specified portion) of the plasma source gas supply pipe 123b to the other end thereof.

As can be seen from the concentration distribution of plasma active species in the plasma generation chamber 141a, the concentration of the plasma active species is saturated (or in a saturated state) from the middle portion of the plasma source gas supply pipe 123b in the vertical direction. In the concentration distribution diagram shown in FIG. 5, the concentration distribution in the reference example shown in FIG. 4 is indicated by a dashed line I. The concentration is saturated at a portion above the middle portion denoted by reference numeral "160". At the portion above the middle portion 160 at which the concentration of the plasma active species is in the saturated state, the width of the pair of plasma electrodes 143e and 143f facing the discharge area may not be changed.

Accordingly, in the one modification, the width of the pair of plasma electrodes 143e and 143f facing the discharge area remains constant from the middle portion 160 to the other end (the upper part). The middle portion 160 corresponds to a position where the concentration of the plasma active species in the plasma generation chamber 141a is in the saturated state, and the width from the position 160 from the other end is constant.

Even in the one modification, the width of the pair of plasma electrodes 143e and 143f facing the discharge area is changed from the one end (the lower part) to the middle portion 160. The width of the pair of plasma electrodes 143e and 143f facing the discharge area is wide in the end side (the lower part) of the plasma source gas supply pipe 123b and gets narrower up to the middle portion 160.

With these configurations of the plasma processing apparatus 100a according to the modification, the size of the discharge area is set such that the concentration distribution of plasma active species generated in the plasma generation chamber 141a becomes uniform. With such a configuration, similar to the plasma processing apparatus 100 shown in FIG. 3, the plasma processing apparatus 100a can further reduce a subtle difference in deposition rate and/or film quality between the semiconductor wafers 1 disposed on the upper stages of the process chamber 101 and the semiconductor wafers 1 disposed on the lower stages thereof.

Second Embodiment

Figure 6:
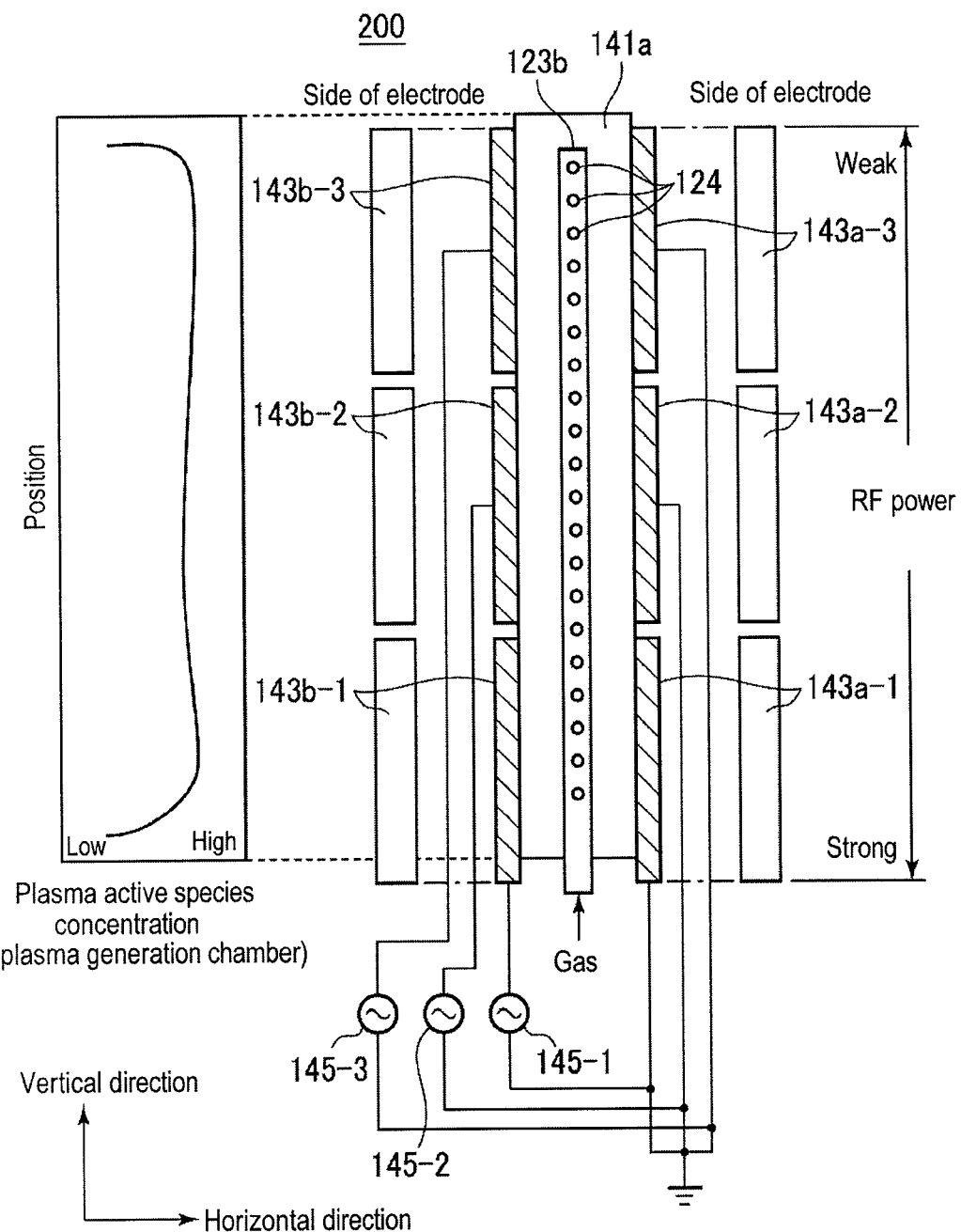
FIG. 6 is a sectional view showing a plasma processing apparatus according to a second embodiment of the present disclosure.

FIG. 6 is a sectional view showing a plasma processing apparatus according to a second embodiment of the present disclosure. FIG. 6 shows a sectional view corresponding to FIG. 3, a side view of the plasma electrodes 143a-1 to 143a-3 and 143b-1 to 143b-3, a concentration distribution diagram of plasma active species in the plasma generation chamber 141a and a magnitude of radio frequency (RF) power.

As shown in FIG. 6, a plasma processing apparatus 200 according to the second embodiment is different from the plasma processing apparatus 100 according to the first embodiment in that the pair of plasma electrodes 143a and 143b is divided into a plurality of plasma electrodes 143a-1 to 143a-3 and 143b-1 to 143b-3 in the vertical direction.

In addition, the plasma processing apparatus 200 is configured such that RF power applied to each pair of plasma electrodes 143a-1 and 143b-1, 143a-2 and 143b-2, and 143a-3 and 143b-3 may be different from each other.

In the plasma processing apparatus 200 according to the second embodiment, the RF power is strong (intensive, high) in the one end side (the lower part) of the plasma source gas supply pipe 123b and becomes weaker (smaller, lower) toward the other end side (the upper part) thereof. In one example, RF power of 150 W is supplied from a first RF power supply 145-1 to the pair of plasma electrodes 143a-1 and 143b-1 located in the lowermost part. RF power of, for example, 120 W is supplied from a second RF power supply 145-2 to the pair of plasma electrodes 143a-2 and 143b-2 located in the middle part. RF power of, for example, 100 W is supplied from a third RF power supply 145-3 to the pair of plasma electrodes 143a-3 and 143b-3 located in the uppermost part.

The RF power applied to the pairs of plasma electrodes 143a-1 and 143b-1, 143a-2 and 143b-2, and 143a-3 and 143b-3 is relatively strong in the one end side (the lower part) of the plasma source gas supply pipe 123b and becomes weaker toward the other end side (the upper part) thereof.

As described above, by changing and setting the RF power such that the concentration distribution of plasma active species generated in the plasma generation chamber 141a becomes uniform, the concentration distribution of plasma active species in the plasma generation chamber 141a can be more uniform than that in the reference example shown in FIG. 4, for example.

Similar to the first embodiment, the concentration distribution of plasma active species in the plasma generation chamber 141a may become uniform in the second embodiment. Accordingly, it is possible to further reduce a subtle difference in a deposition rate and/or film quality between the semiconductor wafers 1 disposed on the upper stages of the process chamber 101 and the semiconductor wafers 1 disposed on the lower stages thereof.

In addition, although, in this embodiment, the pair of plasma electrodes 143a and 143b is divided into three pairs of plasma electrodes 143a-1 and 143b-1, 143a-2 and 143b-2, and 143a-3 and 143b-3, the number of divisions is not limited to "3" but may be varied. That is, the number of divisions may be a finite value of "2" or more.

In addition, in this embodiment, the width of the pairs of plasma electrodes facing the discharge area is set to be constant from the one end to the other end. However, the second embodiment may be used in combination with the first embodiment. For example, the width of the lowermost pair of plasma electrodes 143a-1 and 143b-1 facing the discharge area may be larger than that of the upper pair of plasma electrodes 143a-2 and 143b-2 facing the discharge area.

As described above, by adjusting the width facing the discharge area and the associated applied RF power, it is possible to provide a more uniform concentration distribution of plasma active species in the plasma generation chamber 141a.

Third Embodiment

Figure 7:
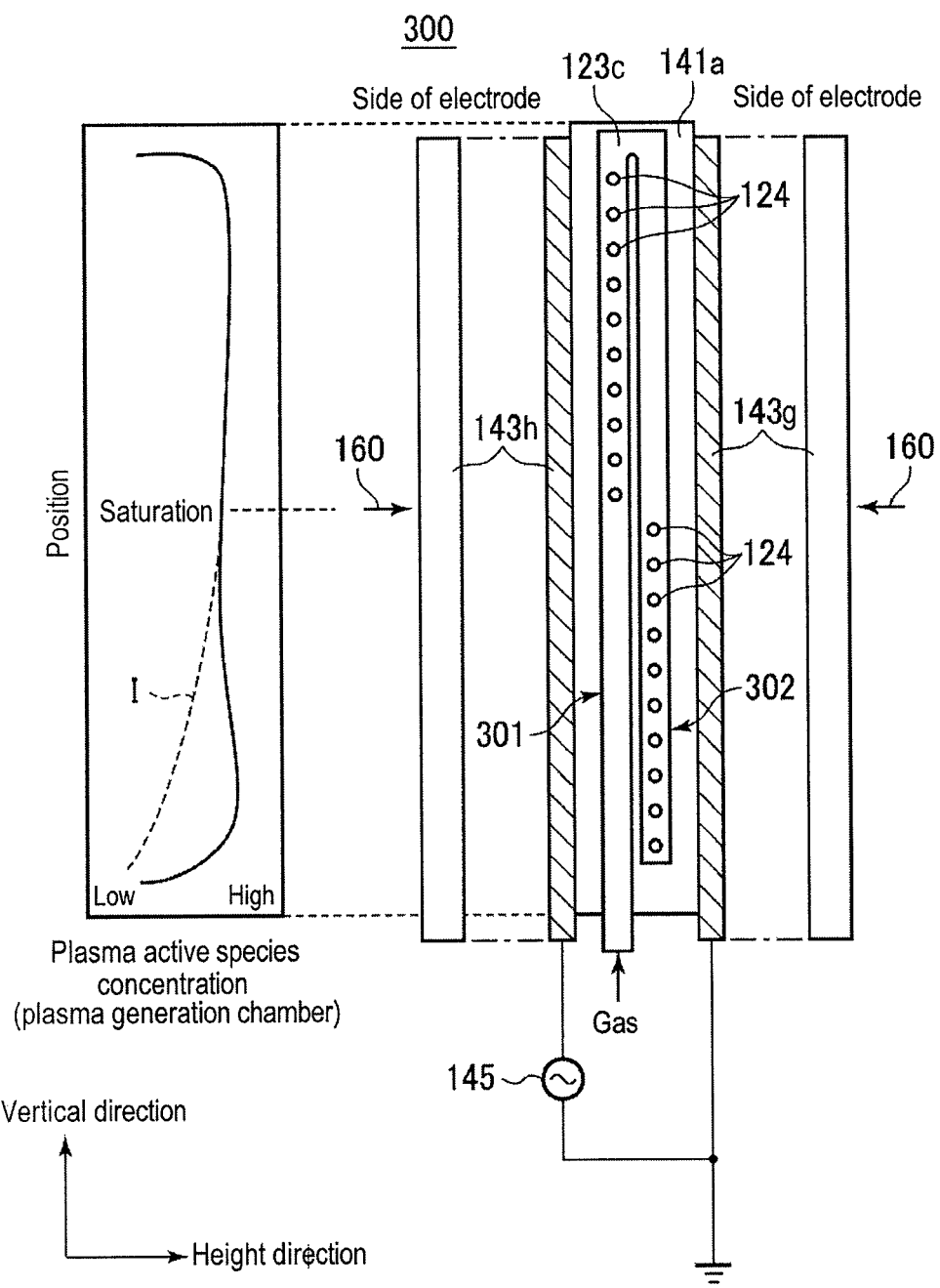
FIG. 7 is a sectional view showing a plasma processing apparatus according to a third embodiment of the present disclosure.

FIG. 7 is a sectional view showing a plasma processing apparatus according to a third embodiment of the present disclosure. FIG. 7 shows a sectional view corresponding to FIG. 3, a side view of the plasma electrodes 143g and 143h and a concentration distribution diagram of plasma active species in the plasma generation chamber 141a.

As shown in FIG. 7, a plasma processing apparatus 300 according to the third embodiment is different from the plasma processing apparatus 100 according to the first embodiment in that a plasma source gas supply pipe 123c extending in the vertical direction is folded from the other end side (the upper part) of the plasma generation chamber 141a toward the one end side (the lower part) of the plasma generation chamber 141a.

The plasma source gas supply pipe 123c has one end disposed in the lower part of the plasma generation chamber 141a, similar to the plasma source gas supply pipe 123b of the first embodiment, into which the plasma source gas is introduced. The plasma source gas introduced into the plasma source gas supply pipe 123c flows upward through the plasma source gas supply pipe 123c while being exposed to the RF electric field.

As described in the one modification of the first embodiment, the concentration of plasma active species in the plasma generation chamber 141a is saturated from the middle portion of the plasma source gas supply pipe 123c in the vertical direction. After the plasma source gas flows through the plasma source gas supply pipe 123c by some distance, the plasma source gas discharged into the plasma generation chamber 141a through the plurality of gas discharge holes 124 can be uniformly activated without substantially depending on exposure time of the plasma source gas to the RF electric field. The third embodiment is based on this consideration.

In the third embodiment, the plasma source gas supply pipe 123c includes an extending portion 301 extending from the one end side (the lower part) to the other end side (the upper part) of the plasma generation chamber 141a, and a folding portion 302 folding from the other end side (the upper part) to the one end side (the lower part) of the plasma generation chamber 141a. Accordingly, in the third embodiment, the plurality of gas discharge holes 124 is distributed over the extending portion 301 and the folding portion 302 so that the concentration distribution of plasma active species generated in the plasma generation chamber 141a can become uniform.

In one example, as shown in FIG. 7, the plurality of gas discharge holes 124 is distributed on the other end side (the upper part) of the plasma generation chamber 141a in the extending portion 301 and distributed on the one end side (the lower part) of the plasma generation chamber 141a in the folding portion 302.

In addition, in this example, a switching position between a portion where the plurality of gas discharge holes 124 is distributed on the other end side (the upper part) of the plasma generation chamber 141a and a portion where the plurality of gas discharge holes 124 is distributed on the one end side (the lower part) of the plasma generation chamber 141a is set in association with (or corresponds to) the middle portion 160 where the concentration of plasma active species becomes saturated.

By forming the plurality of gas discharge holes 124 in the plasma source gas supply pipe 123c in such a manner, the plasma source gas may flow through the plasma source gas supply pipe 123c beyond the middle portion 160 where the concentration of plasma active species concentration becomes saturated, as can be seen from the concentration distribution diagram shown in FIG. 7. With such a configuration, the plasma source gas discharged into the plasma generation chamber 141a can be more uniformly activated than that in the reference example shown in FIG. 4, without substantially depending on exposure time of the plasma source gas to the RF electric field.

Similar to the first embodiment, in the third embodiment, the concentration distribution of plasma active species in the plasma generation chamber 141a may be more uniform. In addition, it is possible to further reduce subtle differences in deposition rate and/or film quality between the semiconductor wafers 1 disposed on the upper stages of the process chamber 101 and the semiconductor wafers 1 disposed on the lower stages thereof.

First Modification of Third Embodiment

Figure 8:
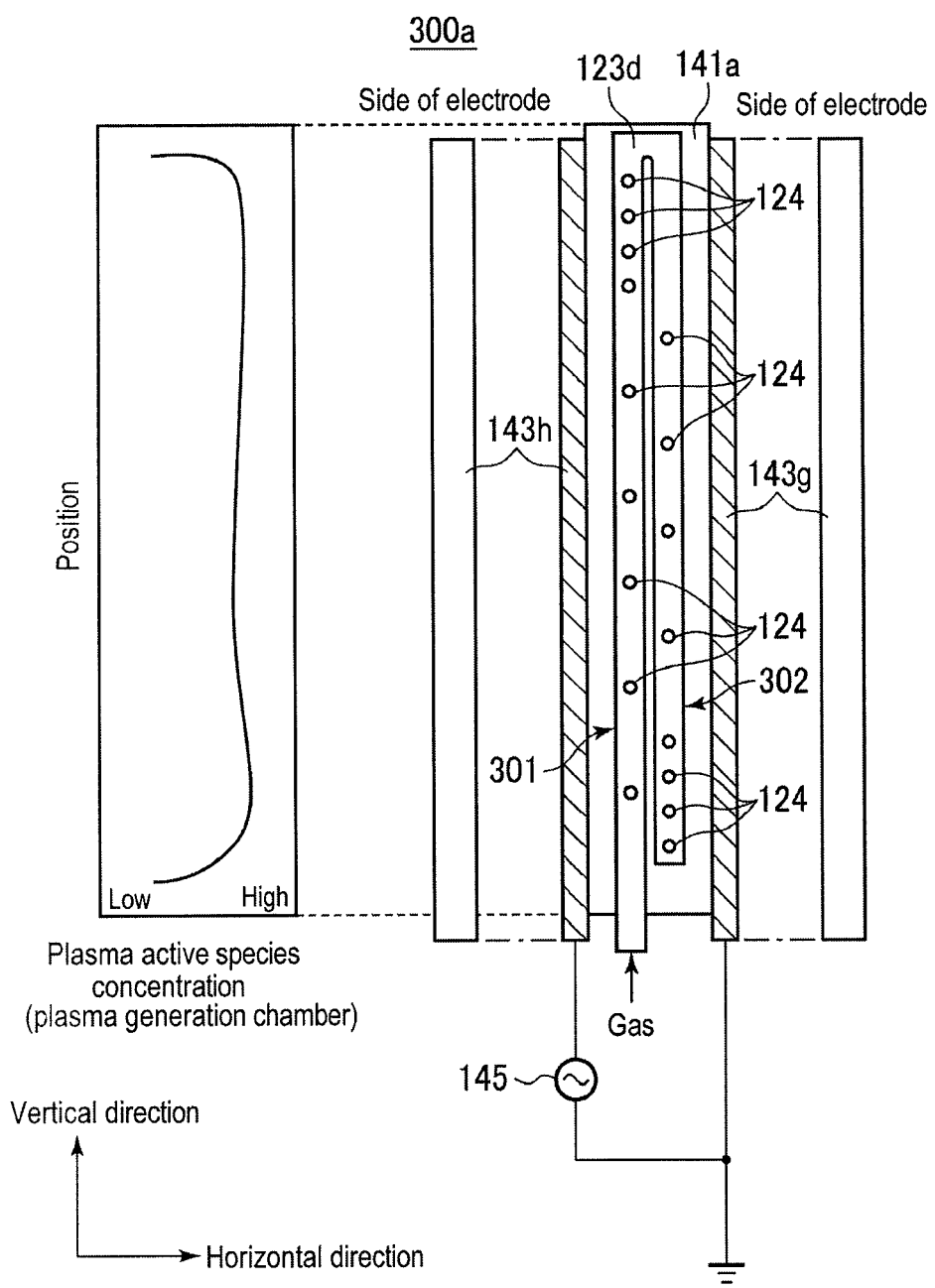
FIG. 8 is a sectional view showing a plasma processing apparatus according to a first modification of the third embodiment of the present disclosure.

FIG. 8 is a sectional view showing a plasma processing apparatus according to a first modification of the third embodiment of the present disclosure. FIG. 8 shows a sectional view corresponding to FIG. 3, a side view of the plasma electrodes 143g and 143h and a concentration distribution diagram of plasma active species in the plasma generation chamber 141a.

In the example of the third embodiment shown in FIG. 7, the plurality of gas discharge holes 124 is distributed on the other end side (the upper part) of the plasma generation chamber 141a in the extending portion 301 and distributed on the one end side (the lower part) of the plasma generation chamber 141a in the folding portion 302.

However, the third embodiment is not limited to the example shown in FIG. 7. As shown in a plasma processing apparatus 300a according to the first modification shown in FIG. 8, the plurality of gas discharge holes 124 may be distributed over each of the extending portion 301 and the folding portion 302 as long as the concentration distribution of plasma active species in the plasma generation chamber 141a can be made uniform. In the plasma processing apparatus 300a according to the first modification, the plurality of gas discharge holes 124 has a pattern of alternate formation in the middle portion of the plasma source gas supply pipe 123d. Similar to the plasma processing apparatus 300 according to the third embodiment, the plurality of gas discharge holes 124 may be distributed over each of the extending portion 301 and the folding portion 302.

Second Modification of Third Embodiment

FIG. 9 is a sectional view showing a plasma processing apparatus according to a second modification of the third embodiment of the present disclosure. FIG. 9 shows a sectional view corresponding to FIG. 3, a side view of the plasma electrodes 143g and 143h and a concentration distribution diagram of plasma active species in the plasma generation chamber 141a.

In the example of the third embodiment shown in FIG. 7 and the first modification of the third embodiment shown in FIG. 8, the plurality of gas discharge holes 124 is distributed over each of the extending portion 301 and the folding portion 302 as long as the concentration distribution of plasma active species in the plasma generation chamber 141a can be made uniform.

However, in plasma processing apparatus 300b according to the second modification of the third embodiment shown in FIG. 9, the plurality of gas discharge holes 124 is formed on the folding portion 302 of the plasma source gas supply pipe 123e.

Such a formation pattern of the gas discharge holes 124 may be employed in a case where the plasma source gas flowing throughout the extending portion 301 flows through the folding portion 302 sufficiently beyond the position where the concentration of plasma active species becomes saturated.

In addition, in the plasma processing apparatus 300b according to the second modification of the third embodiment, the plasma source gas flows through the plasma source gas supply pipe 123e for longer time until the plasma source gas is discharged out of the plurality of gas discharge holes 124. With such a configuration, if it is hard to activate the plasma source gas, the plasma source gas can be guided to the folding portion 302 where the plurality of gas discharge holes 124 is formed (sufficiently beyond the position where the plasma active species concentration becomes saturated).

As described above, in the plasma processing apparatus 300b according to the second modification of the third embodiment, the concentration distribution of plasma active species in the plasma generation chamber 141a can be made uniform, similar to the first embodiment. In addition, the concentration distribution can be effectively made uniform even when it is hard to activate the plasma source gas.

The third embodiment has been illustrated by way of the example, in addition to the first modification and the second modification. In these example and modifications, the width of the pair of plasma electrodes 143g and 143h facing the discharge area is set to be constant from the one end to the other end similar to the pair of plasma electrodes 143c and 143d of the reference example. However, the pair of plasma electrodes 143g and 143h is not limited to the above-described configuration but may be configured in different ways. For example, the pair of plasma electrodes 143g and 143h may employ the configuration of the pair of plasma electrodes 143a and 143b of the first embodiment or the pair of plasma electrodes 143e and 143f of the modification of the first embodiment.

When the first to third embodiments are in proper combination, a variety of materials (e.g., gases) having different activation can be activated to uniformalize the concentration distribution of plasma active species in the plasma generation chamber 141a.

Fourth Embodiment

FIG. 10 is a sectional view showing a plasma processing apparatus according to a fourth embodiment of the present disclosure. FIG. 10 shows a longitudinal sectional view corresponding to the longitudinal sectional view shown in FIG. 1 and a concentration distribution diagram of plasma active species in the plasma generation chamber 141a.

The first to third embodiments are related to the concentration distribution of plasma active species in the plasma generation chamber 141a. The fourth embodiment is related to a concentration distribution of plasma active species in the process chamber 101 rather than that in the plasma generation chamber 141a.

As shown in FIG. 10, a plasma processing apparatus 400 according to the fourth embodiment includes a main plasma generation chamber 141m for generating plasma active species and a sub plasma generation chamber 141s for generating plasma active species in the same or similar manner. Similar to the first embodiment, workpieces or target processing objects (for example, semiconductor wafers 1) are supported on the vertical wafer boat 105 and are accommodated and vertically stacked in the process chamber 101. Plasma active species generated in the main plasma generation chamber 141m and the sub plasma generation chamber 141s are supplied into the process chamber 101 through the plurality of openings 142 in the horizontal direction.

Although a precursor gas supply pipe similar to the precursor gas supply pipe 123a is described with reference to FIG. 1, a manifold, an exhaust port and so on may be installed in the process chamber 101 (these components are not shown in FIG. 10). Instead, differences between the fourth embodiment and the first embodiment will be basically focused and described below.

A first plasma source gas supply pipe 123m is disposed within the main plasma generation chamber 141m. The first plasma source supply pipe 123m extends in the vertical direction and has one end into which the plasma source gas serving as a plasma source is introduced from below the main plasma generation chamber 141m. A plurality of gas discharge holes 124 is formed in the first plasma source gas supply pipe 123m in the vertical direction and the plasma source gas is discharged into the main plasma generation chamber 141m through the plurality of gas discharge holes 124 in the horizontal direction.

A pair of first plasma electrodes 143m is installed to face each other, for example in the outer side of the main plasma generation chamber 141m. The pair of first plasma electrodes 143m is configured to apply an electric field to the plasma source gas discharged into the main plasma generation chamber 141m. Only one of the pair of first plasma electrodes 143m is shown in FIG. 10. The pair of first plasma electrodes 143m is similar to the pair of plasma electrodes 143g and 143h described with reference to FIG. 7. For example, a width of the pair of first plasma electrodes 143m facing the discharge area is constant. However, the plasma electrodes 143a and 143b, 143e and 143f, and 143g and 143h described in the first to third embodiments may be employed as the pair of first plasma electrodes 143m.

A second plasma source gas supply pipe 123s is disposed within the sub plasma generation chamber 141s. The second plasma source gas supply pipe 123s extends in the vertical direction and has one end into which the plasma source gas serving as a plasma source is introduced from below the sub plasma generation chamber 141s in this example. Similar to the first plasma source gas supply pipe 123m, a plurality of gas discharge holes 124 is formed in the second plasma source gas supply pipe 123s in the vertical direction. The plasma source gas is discharged into the sub plasma generation chamber 141s through the plurality of gas discharge holes 124 in the horizontal direction.

A pair of second plasma electrodes 143s is installed to face each other, for example in the outer side of the sub plasma generation chamber 141s. The pair of second plasma electrodes 143s is configured to apply an electric field to the plasma source gas discharged into the sub plasma generation chamber 141s. The pair of second plasma electrodes 143s is similar to the pair of plasma electrodes 143g and 143h described with reference to FIG. 7. For example, a width of the pair of second plasma electrodes 143s facing the discharge area is constant. However, the plasma electrodes 143a and 143b, 143e and 143f, and 143g and 143h described in the first to third embodiments may be employed as the pair of second plasma electrodes 143s.

In the fourth embodiment, the main plasma generation chamber 141m entirely extends in the vertical direction from the one end side (the lower part) of the process chamber 101 toward the other end side (the upper part) thereof. The sub plasma generation chamber 141s partially extends in the vertical direction from the one end side (the lower part) of the process chamber 101 up to the middle portion thereof.

With such a configuration, the plasma active species generated in the main plasma generation chamber 141m are entirely supplied from the one end side (the lower part) of the process chamber 101 toward the other end side (the upper part) thereof. In addition, the plasma active species generated in the sub plasma generation chamber 141s are partially supplied from the one end side of the process chamber 101 toward the middle portion thereof.

As described above, in the fourth embodiment, the plasma active species from the sub plasma generation chamber 141s are partially supplied into the process chamber 101. The plasma active species partially supplied from the sub plasma generation chamber 141s into the process chamber 101 can assist the plasma active species supplied from the main plasma generation chamber 141m into the process chamber 101.

In the lower part of the process chamber 101, the concentration of plasma active species may be low when only the plasma active species from the main plasma generation chamber 141m is supplied. In some examples of the fourth embodiment, however, the plasma active species are supplied from the sub plasma generation chamber 141s into the process chamber 101 so that the concentration distribution of plasma active species in the process chamber 101 can be made uniform.

Thus, in the fourth embodiment, the concentration distribution of plasma active species in the process chamber 101 can be improved over the reference example shown in FIG. 4, similar to the first to third embodiments. In addition, it is possible to further reduce a subtle difference in a deposition rate and/or film quality between the semiconductor wafers 1 disposed on the upper stages of the process chamber 101 and the semiconductor wafers 1 disposed on the lower stages thereof.

In some examples, the sub plasma generation chamber 141s may be installed to correspond to a position where the concentration of plasma active species in the process chamber 101 does not reach the saturated state (e.g., remains in an unsaturated state) with only the plasma active species from the main plasma generation chamber 141m.

Although the present disclosure has been described above by way of the first to fourth embodiments, the present disclosure is not limited to the above embodiments but may be modified in different ways without departing from the spirit and scope of the disclosure.

For example, although, in the first to fourth embodiments, the plasma source gas has been illustrated with the $NH_3$ gas used for plasma nitridation or radical nitridation. The plasma source gas is not limited to the $NH_3$ gas. In the plasma processing apparatuses according to the first to fourth embodiments, plasma source gases other than the $NH_3$ gas may be used as long as they are suitable for plasma processing.

In addition, although, in the first to fourth embodiments, the plasma processing has been illustrated with the deposition of silicon nitride film, the plasma processing is not limited thereto. The plasma processing apparatuses according to the first to fourth embodiments may be used for deposition of films other than the silicon nitride film.

In addition, the plasma processing is not limited to the deposition but the first to fourth embodiments, the plasma processing may be applied to other various processes including etching, oxidation, diffusion, modification, natural oxide removal and so on.

In addition, although, in the first to fourth embodiments, the workpiece has been illustrated with a semiconductor wafer (typically a silicon wafer), the workpiece is not limited to the semiconductor wafer. Any workpieces may be employed as long as they can be subjected to plasma processing. For example, the first to fourth embodiments may be applied to other workpieces such as glass substrates used for flat panel displays, organic ELs, solar cell panels and so on.

According to the present disclosure in some embodiments, it is possible to provide a plasma processing apparatus capable of further reducing a subtle difference in a deposition rate and/or film quality between workpieces disposed on upper stages of a process chamber and workpieces disposed on lower stages thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus comprising:
  a plasma generation chamber in which plasma active species are generated;
  a process chamber configured to accommodate therein processing target objects which are stacked in a vertical direction, the plasma active species generated in the plasma generation chamber being supplied into the process chamber;
  a plasma source gas supply pipe disposed inside the plasma generation chamber and extending in the vertical direction, a plasma source gas serving as a plasma source being introduced from a lower end of the plasma source gas supply pipe and discharged through a plurality of gas discharge holes which is formed in the plasma source gas supply pipe in the vertical direction; and
  a pair of plasma electrodes, arranged to face each other, configured to apply an electric field to the plasma source gas discharged into the plasma generation chamber,
  wherein each of the pair of plasma electrodes has a surface facing a discharge area within the plasma generation chamber and interposed between the pair of plasma electrodes, and a surface area of the surface facing the discharge area is larger in the vicinity of a lower part of the plasma source gas supply pipe than in the vicinity of an upper part of the plasma source gas supply pipe such that a size of the discharge area is varied in the vertical direction, without varying a distance between the pair of plasma electrodes.

2. The plasma processing apparatus of claim 1, wherein the surface area of the pair of plasma electrodes gets narrower from the vicinity of the lower part of the plasma source gas supply pipe toward the vicinity of the upper part of the plasma source gas supply pipe up to the vicinity of a middle portion of the plasma source gas supply pipe, and the surface area of the pair of plasma electrodes is constant from the vicinity of the middle portion to the vicinity of an upper end of the plasma source gas supply pipe.

3. The plasma processing apparatus of claim 2, wherein the middle portion corresponds to a position where a concentration of the plasma active species becomes saturated.

4. The plasma processing apparatus of claim 1, wherein the size of the discharge area is set such that a concentration distribution of the plasma active species generated in the plasma generation chamber becomes uniform.

5. A plasma processing apparatus comprising:
- a plasma generation chamber in which plasma active species are generated;
- a process chamber configured to accommodate therein processing target objects which are stacked in a vertical direction, the plasma active species generated in the plasma generation chamber being supplied into the process chamber;
- a plasma source gas supply pipe disposed inside the plasma generation chamber and extending in the vertical direction, a plasma source gas serving as a plasma source being introduced from a lower end of the plasma source gas supply pipe and discharged through a plurality of gas discharge holes which is formed in the plasma source gas supply pipe in the vertical direction; and
- a pair of plasma electrodes, arranged to face each other, configured to apply an electric field to the plasma source gas discharged into the plasma generation chamber, wherein the plasma source gas supply pipe includes an extending portion extending from a lower end of the plasma generation chamber to an upper end of the plasma generation chamber, and a folding portion folding from the upper end of the plasma generation chamber to the lower end of the plasma generation chamber, the extending portion communicating with the folding portion, wherein the plurality of gas discharge holes is distributed over the extending portion and the folding portion such that, in a middle of the extending portion and the folding portion, the plurality of gas discharge holes is alternately formed on the extending portion and the folding portion to have different heights from each other, and wherein each of the pair of plasma electrodes has a surface facing a discharge area within the plasma generation chamber and interposed between the pair of plasma electrodes, and a surface area of the surface facing the discharge area is larger in the vicinity of a lower part of the plasma source gas supply pipe than in the vicinity of an upper part of the plasma source gas supply pipe such that a size of the discharge area is varied in the vertical direction, without varying a distance between the pair of plasma electrodes.

6. The plasma processing apparatus of claim 5, wherein the plurality of gas discharge holes is distributed over the extending portion and the folding portion such that a concentration distribution of the plasma active species generated in the plasma generation chamber becomes uniform.

* * * * *